United States Patent [19]

Daughton et al.

[11] Patent Number: 5,060,193
[45] Date of Patent: Oct. 22, 1991

[54] MAGNETIC STATE ENTRY ASSURANCE

[75] Inventors: James M. Daughton, Edina; Allan T. Hurst, Jr., Anoka, both of Minn.; Arthur V. Pohm, Ames, Iowa

[73] Assignee: Honeywell Inc., Minneapolis, Minn.

[21] Appl. No.: 505,090

[22] Filed: Apr. 4, 1990

[51] Int. Cl.$^5$ ............................................. G11C 11/15
[52] U.S. Cl. ..................................... 365/173; 365/158
[58] Field of Search ................................. 365/158, 173

[56] References Cited

U.S. PATENT DOCUMENTS 4,731,757 3/1988 Daughton et al. ............... 365/173
4,780,848 10/1988 Daughton et al. ............... 365/173
4,829,476 5/1990 DuPuis et al. ................... 365/158
4,918,655 4/1990 Daughton ......................... 365/173

Primary Examiner—Joseph A. Popek
Attorney, Agent, or Firm—Gregory A. Bruns; Theodore F. Neils

[57] ABSTRACT

A method for storing selected magnetic states in magnetic bit structures so as to assure establishment of the desired state therein. A first word line current, used for storing a magnetic state, is followed by providing a second word line current. The second line current assures establishment of the desired state in the magnetic bit structure by overcoming any pinning of a magnetic wall.

20 Claims, 5 Drawing Sheets

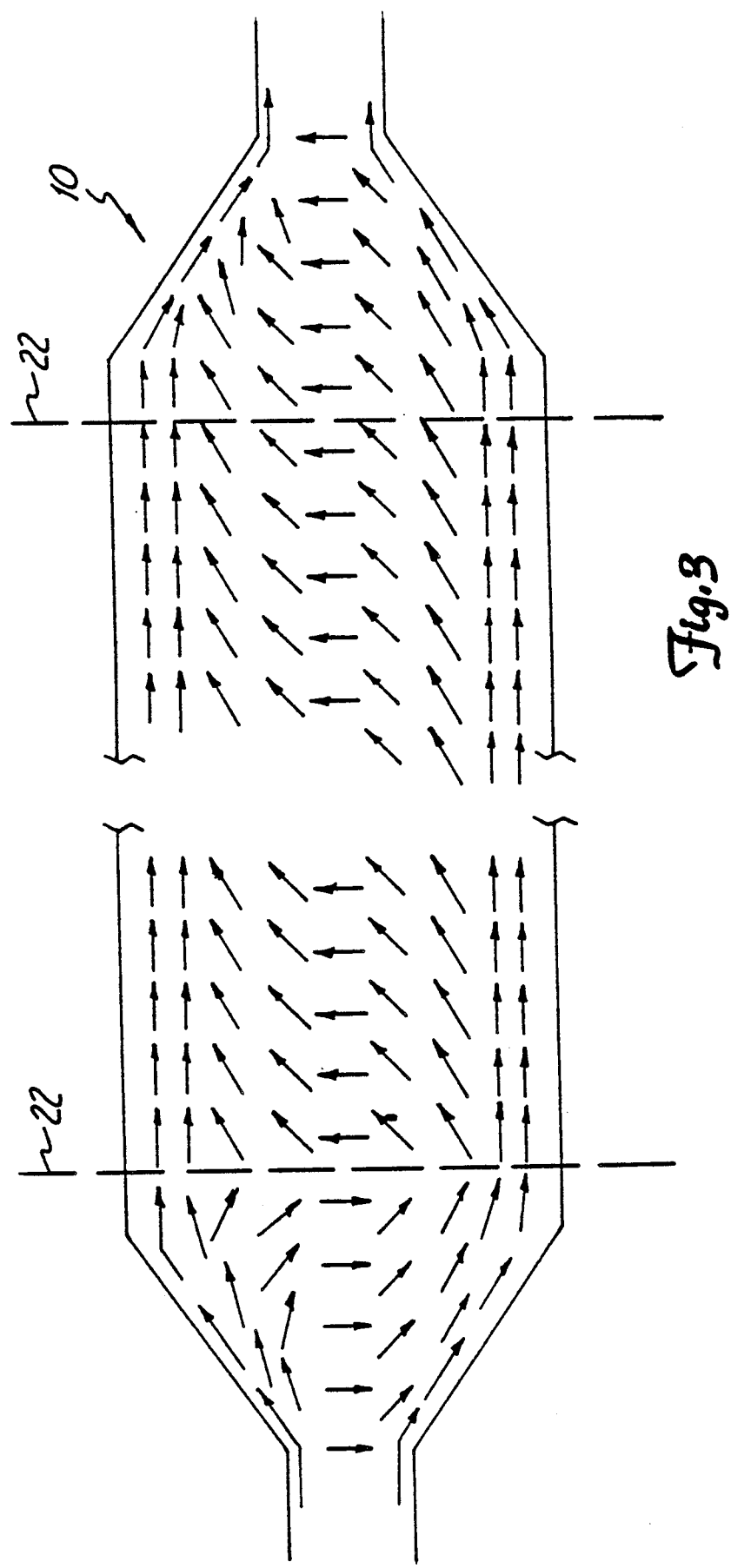

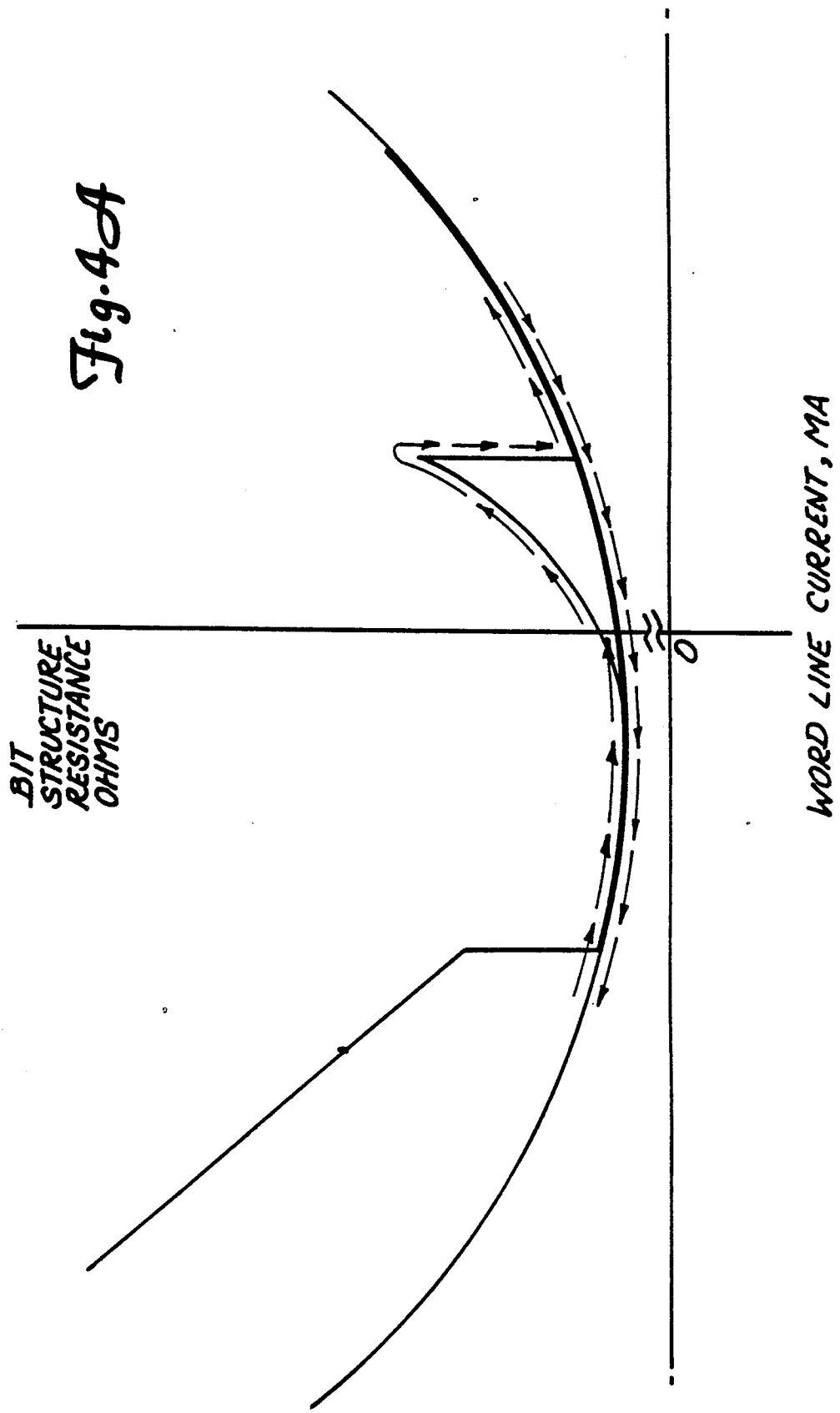

1

MAGNETIC STATE ENTRY ASSURANCE

The Government has rights in this invention pursuant to Contract No. 87F345500 with the Office of Research and Development.

BACKGROUND OF THE INVENTION

The present invention relates to ferromagnetic thin-film memories and, more particularly, to ferromagnetic thin-film memories in which information states of the memory cells are based on alternative magnetization directions along the easy axis of the thin-film.

Digital memories of various kinds are used extensively in computers and computer system components, digital processing systems, and the like. Such memories can be formed, to considerable advantage, based on the storage of digital system bits as alternative states of magnetization in magnetic materials in each memory cell, typically ferromagnetic thin-film materials. The information stored in such films is stored therein through selected directions of magnetization occurring in that film, this information being obtainable from such films through either inductive sensing to determine the magnetization state, or by magnetoresistive sensing of such states. Ferromagnetic thin-film memories of this nature may be conveniently provided on the surface of a monolithic integrated circuit chip to provide easy electrical interconnections between the memory cells and the memory operating circuitry provided in the chip.

Ferromagnetic thin-film memory cells can be made very small and they can be packed very closely together to achieve a significant density of stored information bits, properties which are the basis of permitting them to be provided on the surface of a monolithic integrated circuit, as indicated above. Suitable constructions for such cells can be found in U.S. Pat. Nos. 4,731,757 to Daughton et al entitled "Magnetoresistive Memory Including Thin Film Storage Cells having Tapered Ends" and U.S. Pat. No. 4,780,848 to Daughton et al entitled "Magnetic Memory" and an earlier filed application by J. M. Daughton having U.S. Pat. No. 4,918,655 entitled "Magnetic Device Integrated Circuit Interconnection System," all of which have been assigned to the same assignee as the present application and are herein incorporated by reference. A structure analogous in some respects to those disclosed there is shown, as an example, in FIG. 1.

There, a bit structure, 10, from a series string of them in a monolithic integrated circuit is presented in a portion of that integrated circuit such that the opposite ends thereof, 11, are exposed. Bit structure 10 is shown formed over a semiconductor material body, 12, in and on which the monolithic integrated circuit is formed. Bit structure 10 is provided directly on an insulating layer, 13, supported on a major surface of body 12 in the integrated circuit chip. As indicated above, just a portion of the integrated circuit is shown, and then only a small part of the semiconductor body for that portion of the integrated circuit is shown in the figure.

Semiconductor material body 12 is typically formed of a doped silicon material of primarily either p- or n-type conductivity, with other regions of opposite conductivity provided therein to form circuit elements or portions of circuit elements. Insulating layer 13 is typically formed of silicon nitride both as an electrical insulator and as an oxygen barrier to prevent any oxygen from migrating therefrom into bit structure 10 and oxidizing any of the magnetic materials therein.

Bit structures like bit structure 10 are usually provided, as previously indicated, in a memory as a series string of such bit structures extending both ways from ends 11 where exposed at the edges of the integrated circuit portion shown in FIG. 1. The bit structures in series are connected to adjacent ones thereof in such an arrangement at junctures, 14, provided at each end of each of such bit structures where they provide an electrical short circuit for interconnecting them, and at the ends of each series string for interconnecting it to other circuit components in the monolithic integrated circuit operating the memory.

The remainder of bit structure 10 disposed on the exposed major surface of insulating layer 13 is comprised of a lower ferromagnetic thin-film, 15, and an upper ferromagnetic thin-film, 16. Ferromagnetic thin-film layers 15 and 16 exhibit uniaxial anisotropy, magnetoresistance, little magnetostriction, and are of an alloy composition typically comprising nickel, cobalt and iron. Typically, proportions of each are chosen to strongly reduce or eliminate any magnetostrictive effects in the films, and to improve certain other properties of them for the application.

Between ferromagnetic thin-film layers 15 and 16 is a further thin layer, 17, which usually would not be one exhibiting ferromagnetism, but may be either an electrical conductor or an electrical insulator. Layer 17 must, however, in this construction, prevent the exchange interaction between electron spins on neighboring atoms from coupling across the separation between layers 15 and 16 to thereby lock together the magnetizations of each. A typical choice for layer 17 would be tantalum doped with nitrogen.

A further diffusion barrier and protective layer, 18, is provided over upper ferromagnetic thin-film 16. This layer again can be formed of nitrogen doped tantalum. In junctures 14 there is further provided two other conductive layers, the first layer, 19, being formed of copper doped aluminum on which is provided a second layer, 20, of tungsten. These layers provide an electrical short between adjacent bit structures as indicated above.

An insulating layer, 21, is then provided to electrically isolate bit structure 10 from further structures to be provided thereabove. Layer 21 is typically formed of silicon nitride. A word line conductor, 22, is then provided over layer 21 extending to the tapered portions at the ends of bit structure 10. Typically, word line 22 extends over several similar bit structures, each one being in a different series string of such bit structures. Both of layers 21 and 22 are only partially shown in FIG. 1, with other portions thereof having been removed from the right-hand portion of bit structure 10 in that figure so that portion of bit structure 10 can be more clearly seen. Word line conductor 22 is typically formed with a thin layer of titanium and tungsten followed by a layer of copper doped aluminum. A passivation layer, 23, of silicon nitride is then provided over the entire structure, though this layer is also only partly shown, to protect it from external contaminants.

Bit structure 10 can be operated in a longitudinal mode having its easy axis extend between junctures 14 perpendicular to the direction of extension of word line conductor 22, or in a transverse mode having its easy axis of magnetization parallel with the direction of extension of word line conductor 22. In either situation, information, kept as a binary bit having one of two alternative logic values in bit structure 10, is stored therein in layers 15 and 16 by having the magnetization oriented to point in one direction or the other (but opposite in each of these layers to the direction in the other), generally along the easy axis of magnetization. If the direction of magnetization is caused to rotate from such a direction by external magnetic fields, the electrical resistance of layers 15 and 16 change with this magnetization direction rotation because of the magnetoresistive properties of such layers.

Near the edges of films 15 and 16, assuming that the easy axis is parallel with word line 22, anisotropy fields are dominated by the demagnetization fields due to the "free poles" at these edges. If the magnetizations of films 15 and 16 were saturated, the demagnetization fields would approach half the saturation fields, or perhaps 5,000 Oersteds, for these films with the alloys described here. Typical films of these alloys will have a coercivity and an anisotropy field on the order of only 20 Oersteds, leading to instabilities in the magnetization at the edges of these films.

In such large demagnetization fields, electron spins at the edge of the films are constrained to lie nearly parallel to these edges and the direction of elongation of these films. The directions of these electron spins only gradually turn to pointing across the films further inward toward the center of the films with the demagnetizing fields no longer overcoming the isotropy field. The rate, shape and distance of the occurrence are all a complex function depending on the magnetostatics of the situation, the quantum exchange interaction between adjacent atom electron spins, and the anisotropy considerations not unlike those leading to Néel walls.

Thus, the magnetization along the transverse axis is at or very nearly at zero at the outer edges of the films where word line 22 crosses them, and gradually increases in inward locations which are closer to the interior of the films, the magnetization value increasing toward the saturation value occurring in the central portions of the films. In the regions between the portions adjacent to the exterior edges of the film and the point where magnetic saturation begins, the film magnetizations are in transition from pointing along the direction of elongation to pointing along the direction of the easy axis. Therefore, such ferromagnetic thin-films having their easy axes extending in directions transverse to the direction of elongation thereof, or parallel to word line 22, do not truly saturate across the films along the easy axis but only across a part of such a film.

A representation of the magnetizations of a section of one of films 15 and 16 from between its tapered parts is shown in FIGS. 2A and 2B. FIG. 2A shows the magnetizations for the storage of a "0" logic value bit of information with the magnetizations at central locations shown pointed upward in that figure and edge magnetizations therein shown pointed primarily to the right. FIG. 2B shows the magnetizations for the storage of a "1" logic value bit of information with the magnetizations at central locations shown pointed downward in that figure, and with edge magnetizations therein shown still pointed primarily to the right.

Sense current refers to the current flow through bit structure 10 from one juncture 14 to the other juncture 14 thereof, and word current refers to current flowing in word line 22 adjacent to, and extending in a direction traverse to the direction of elongation of, bit structure 10. Bit structure 10 can be placed in one of two possible magnetization states along an easy axis thereof as shown in FIGS. 2A and 2B through the selective application of sense and word currents, i.e. information can be stored or "written" into bit structure 10.

Bit structure 10, in the configuration shown in FIG. 1 or in other typical configurations, in the past was typically placed in a "0" logic value magnetization state on the basis of providing a word current of typically 10.0 mA to 30.0 mA flowing in a direction which creates a magnetic field in films 15 and 16 oriented in the same common direction as the edge magnetizations of those films primarily were. A current through word line 22 giving such a result in a magnetic field will be termed a positive word line current or positive word current. Previous to this current flow, the edge magnetizations of films 15 and 16 were set by the application of a strong external magnetic field of typically a few thousand Gauss. The setting of a "0" logic value magnetization state was then completed by coincidentally providing a sense current of typically 2.0 mA to 3.5 mA coincidentally with the provision of the word current.

The opposite magnetization state representing a "1" logic value magnetization state was alternatively set into bit structure 10 through providing the same word current in the same direction, i.e. a positive word current, but providing a sense current of the same magnitude in the opposite direction through bit structure 10. Such magnetization state changes will occur very quickly after the proper current levels are reached, such changes between such states occurring in less than about 10 ns.

This method of establishing a magnetization state in memory films 15 and 16 of the bit structure 10 is generally a reliable way of doing so. However, there is on occasion found to be erroneous information in a bit structure 10 after such a storage procedure. Typically, the provision of a word current and a sense current is done to change the magnetization state of the bit structure 10 to the opposite state. The electron spins are reoriented under word line 22, at least in the central parts of films 15 and 16. As this occurs, the magnetic walls that initially form between the portions of films underneath word line 22 and the end portions thereof outside of word line 22 quickly propagate through the tapered portions to the ends of the films where the taper ceases. This occurs because the energy in the magnetic wall is dependent on the length thereof, and so having the wall propagate into the tapered end portions of bit structure 10 necessarily shortens the walls to thereby reduce the energy thereof. Since magnetic systems tend to minimize the magnetic energy thereof in accord with thermodynamics, the magnetic walls have a strong tendency to propagate to the ends of the tapered sections.

However, there is evidence that in some instances an initial magnetic wall, formed at the initiation of a storage procedure between the memory film portions under word line 22 and those remaining memory film portions not under word line 22, becomes "pinned" at about the edge of word line 22. That is, the initial magnetic wall so formed does not move through the tapered end portions toward the ends thereof as it normally does as a consequence of minimizing the magnetic energy. Rather, the wall stays temporarily in place at the edge of word line 22 where it is subject to propagating in the opposite direction when the sense current is next reversed in its direction of flow. The cause of such "pinning" is not known, but is believed to be related, at least in part, to transitions in a significant portion of the sense current flow, first from juncture 14 shorting tungsten layer 20 to flow in films 15, 16 and 17 through the major portion of bit structure 10, and then from there entering the subsequent shorting layer 20 in the following juncture 14. These sense current flow transitions at these locations are thought to have effects which can on occasion lead to such "pinning" of magnetic walls.

The situation is shown in FIG. 3 in one of memory films 15 and 16 with the edges of word line 22 in FIG. 3 being represented by two vertical dashed lines. There, a magnetic wall is shown formed just at the point in the film portion over which the left edge of word line 22 passes. As can be seen there, the magnetizations in the film to the left of the left edge of word line 22 in the central parts of the film point in the downward direction following the magnetization directions established for the prior magnetization state stored in that film. On the right side of the left edge of word line 22, the magnetizations of the central portions of the film point in the upward direction following the direction of the state that is intended to be stored in the film as the result of the word line current flow for the current storage procedure. Thus, a 180° magnetic wall has formed between these two regions in the film under what would be the left edge of word line 22, if it were shown, and also near where one of the current transitions described occurs. Because of being "pinned," the wall has not propagated to the left as normally occurs.

Upon the cessation of the sense and word line currents, this situation shown in FIG. 3 will remain if a "pinning" of the wall shown has occurred. However, a subsequent reversal of the flow of the sense line current may well occur, possibly in the next information retrieval operation attempting to extract information from the memory. Such a sense current reversal will change the sense current transitions situation and the direction of the magnetic field resulting from the sense current, and could thus both permit and urge this previously "pinned" wall to move to the right so that the prior magnetic state is stored again in bit structure 10 rather than the state attempted to be established by the most recent storage procedure. As a result, erroneous information will come to be present in that bit structure.

Thus, there is a desire to store a selected magnetic state in a bit structure 10 that is not subject to becoming erroneous in subsequent memory storage and retrieval operations. That is, there is a desire to store a magnetization state in bit structure 10 that is complete in the sense of having the magnetization established in the central portions of a memory film in a bit structure be in a more or less common direction throughout those portions of the bit structure.

SUMMARY OF THE INVENTION

The present invention provides a method for storing selected magnetic states in magnetic bit structures of the kind described above through providing a word line current in a direction which results in a magnetic field due thereto, in the memory films of these bit structures, that is oriented substantially parallel to a common direction followed at least partially by orientations of edge magnetizations in these films that are parallel to the edges thereof, providing a selected sense current through these memory films which is at least partially concurrent with the word current described previously, and providing, after cessation of the first word current, another word current which provides a magnetic field in the bit structure memory film that is oriented in a direction opposite the common direction followed at least partially by the orientations of the edge magnetizations. This latter word line current can provide large angular rotation of the magnetizations in some of the central parts of the bit structure to increase the energy per unit length of any "pinned" magnetic wall thereby increasing the forces directed toward causing it to translate through the tapered portion nearest it so that the entire memory film has magnetizations of the central parts thereof all directed in substantially the same direction.

BRIEF DESCRIPTION OF THE DRAWINGS

FIG. 3 shows a diagrammatical representation of a state of a section of the structure shown in FIG. 1, FIG. 4A shows a resistance characteristic of the structure of FIG. 1.

DETAILED DESCRIPTION OF THE PREFERRED EMBODIMENTS

The situation of FIG. 3 results because of the forces, whatever they may be, keeping the magnetic wall at its location at or near the edge of word line 22. If the energy per unit length of the wall could be increased, there would be an increased force attempting to translate the wall to the nearest tapered end of bit structure 10 to thereby minimize the magnetic energy as is required by the laws of thermodynamics.

As indicated above, a magnetic state is stored in bit structure 10 by applying a positive word current and a sense current in one direction or the other through bit structure 10 to select the desired magnetization state to be established therein as a result of these currents. The application thereafter of a negative word current can supply this desired additional energy to the "pinned" wall to thereby result in having that wall gain energy per unit length. The application of a negative word current after the application of the positive word current used in storing the desired state provides a reversed magnetization direction in the center of the memory films to the extent that the central magnetization has an angle between 180° and 270° with respect to orientation of the edge magnetizations of the memory films. The resulting increase in magnetic energy per unit of wall length urges the magnetic wall down the taper because this minimizes the total magnetic energy in the film material system.

Figure 1:
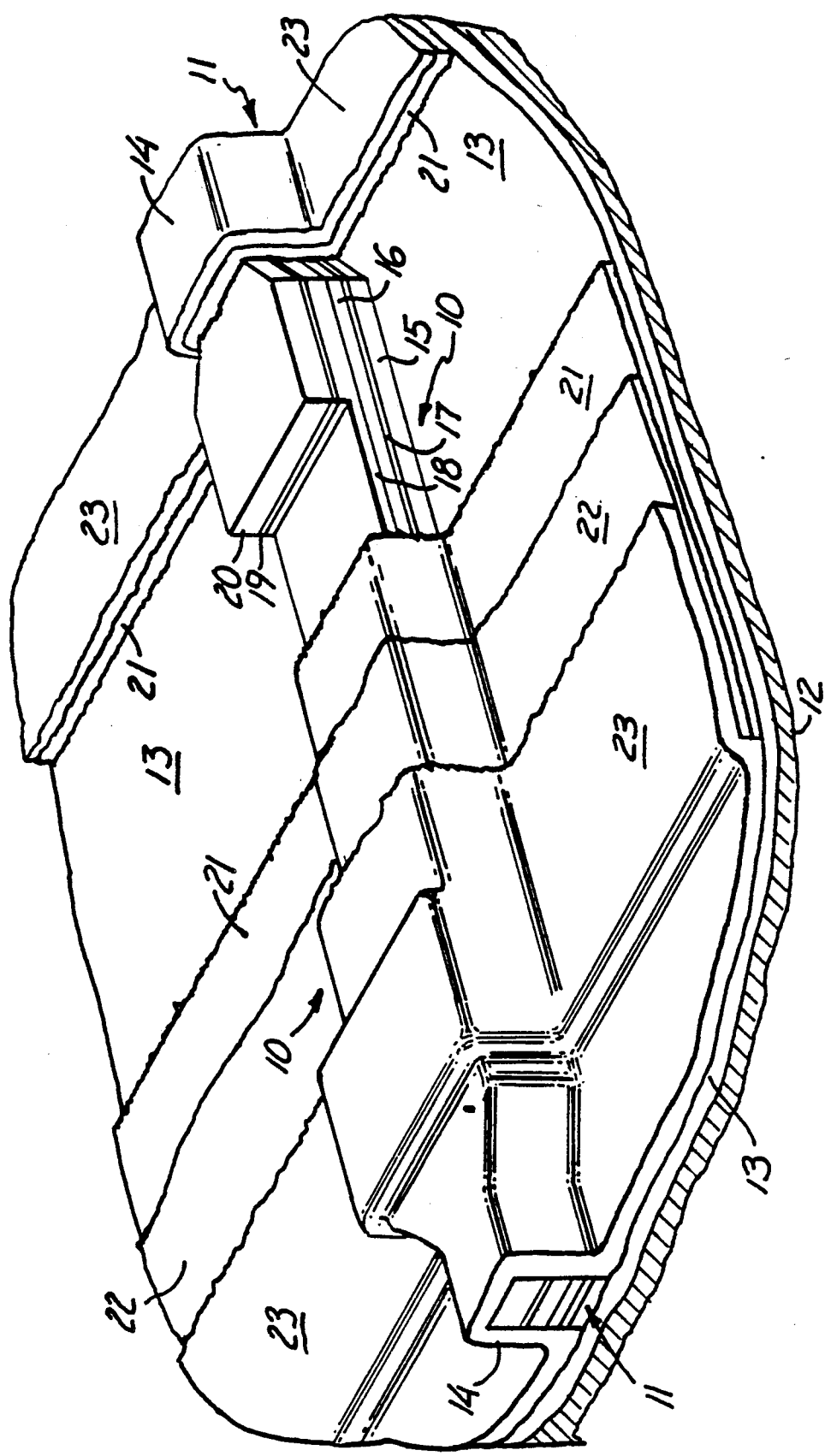
FIG. 1 shows a pictorial view of a portion of a structure with respect to which the present invention is practiced, FIGS. 2A and 2B each show a diagrammatical representation of a state of a section of the structure shown in FIG. 1.

FIG. 4A shows the electrical resistance versus word line current characteristics of bit structure 10 of FIG. 1 in the absence of a "pinned" magnetic wall for both "0" and "1" logic value magnetization states which may alternatively occur therein, the lower characteristic representing the "0" state. The resistance characteristic for both positive and negative word line currents is shown. Again, negative word line currents mean currents flowing through word line 22 in a direction which results in a magnetic field due thereto in the memory films of bit structure 10 that is oriented in a direction opposite a common direction followed at least partially by orientations of edge magnetizations in those films that are parallel to the edges thereof. A positive word line current provides a magnetic field in those films in the opposite direction, or in the common direction.

The dashed line arrows shown on the resistance characteristics for the "0" and "1" magnetization states of bit structure 10 show the locus of electrical resistance changes for the applications of word current of the kind described in the last paragraph. Assuming that the application of word current starts from a zero value, FIG. 4A shows the resistance change locus for the switching of a "1" magnetization state to a "0" state which results from using the method indicated above based on having a negative word current applied following application of a positive word current. A positive word current is first supplied beginning from a value of zero, and the arrows show the supplying of this current involves reaching a value sufficient to travel past the break point in the "1" magnetization characteristic to thereby switch the magnetization vectors (in conjunction with the sense current) to be in a "0" logic value magnetization state. The word current then returns to zero and continues to decrease until a substantial negative word current is provided in word line 22. This negative word current is sufficient to exceed the value required to form a Néel magnetic wall which is the value of negative word current at which the "1" characteristic shifts sharply upward.

Figure 2B:
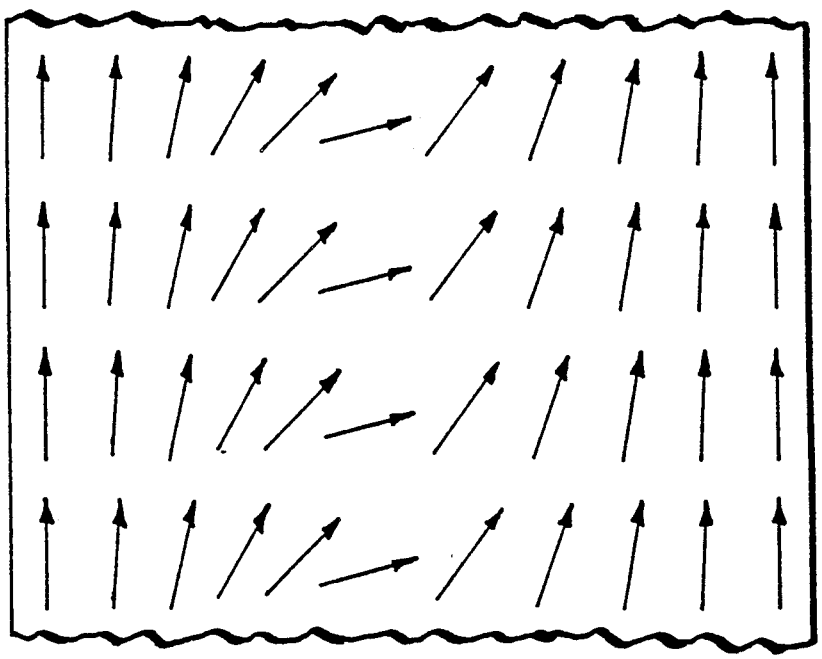
Figure 2A:
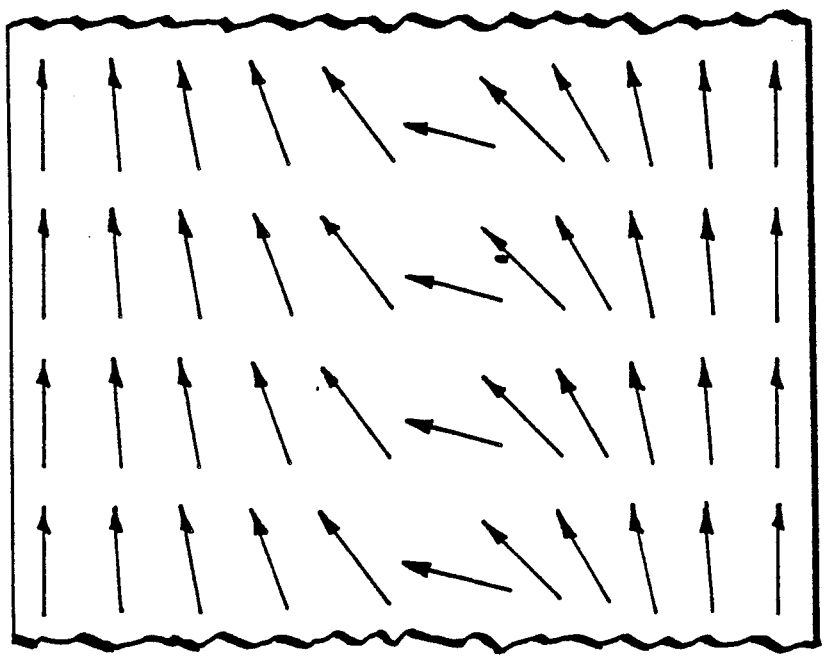

The arrows show the situation in which the magnetizations of the central portions of the memory films of bit structure 10 have all switched from the "1" magnetization state of FIG. 2B to thereafter all be in the proper direction for a "0" state having been established therein as in FIG. 2A. The arrows show that the applied negative word current causes a change in resistance which follows the characteristic for the "0" logic value magnetization state, or the lower characteristic in FIG. 4A. That is, the arrows shown follow along this lower characteristic to the left and then reverse back toward zero word current.

Figure 4B:
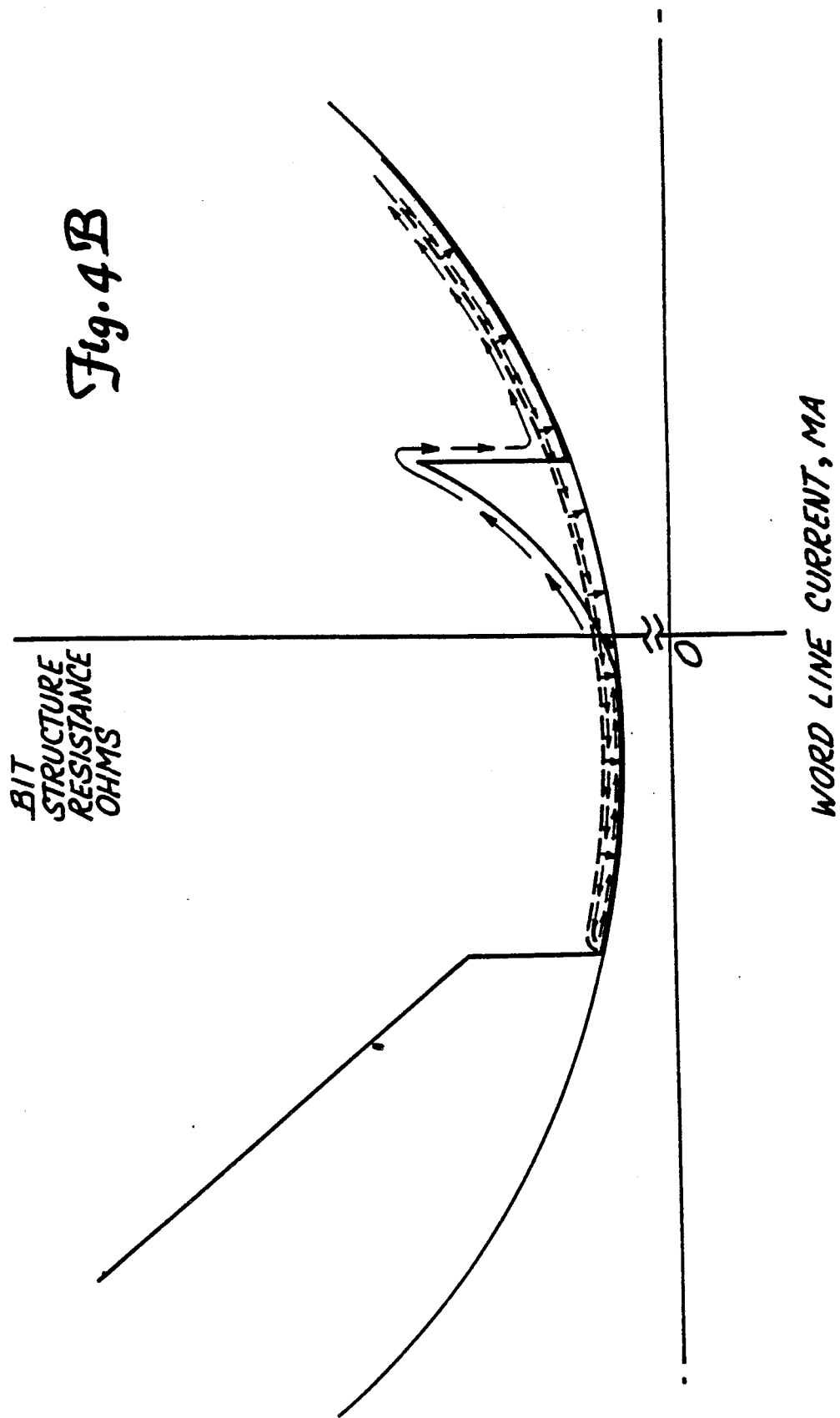
FIG. 4B shows another resistance characteristic of the structure of FIG. 1.

However, if a portion of the memory films of bit structure 10 have magnetizations remaining oriented in the direction consistent with the previous "1" logic value magnetization state therein so that a "pinned" magnetic wall has formed between that portion and the portion newly established in the "0" state orientation by the positive word current (and corresponding sense current), the arrows in the negative word current portion of FIG. 4A would follow a somewhat different resistance characteristic, one intermediate to the "1" and "0" characteristics shown. The result is shown in FIG. 4B with the difference in characteristics exaggerated for clarity. There, the intermediate resistance characteristic is shown as a dashed line. Applying a positive word current first starting from zero, the locus of resistance change is shown for the switching of a "1" magnetization state to a "0" state using the method indicated above of having a negative word current applied following application of a positive word current.

The long arrows in FIG. 4B show the supplying of a positive word current that reaches a value sufficient to travel past the break point in the "1" magnetization characteristic to switch the magnetization vectors (in conjunction with the sense current) to be in a "0" logic value magnetization state. However, after passing the break point, the "1" characteristic is not switched to become the "0" characteristic because the "1" magnetization state does not entirely become the "0" magnetization state due to the "pinned" magnetic wall. Instead, a "mixed" state occurs which has the intermediate resistance shown by the dashed line in FIG. 4B. The word current thus follows this intermediate characteristic instead and returns to zero as shown by the long arrows pointing toward zero along the dashed line characteristic. From zero in the new method, as indicated above, the word current continues to decrease until a substantial negative word current is provided in word line 22 as shown by the long dashed arrows still following the intermediate dashed line resistance characteristic to the left from this zero point. This negative word current is sufficient to exceed the value required to form a Néel magnetic wall, that value of negative word current at which the "1" characteristic shifts sharply upward. At this value of negative word current, the energy of the pinned magnetic wall would very significantly increase so that its energy per unit length also increases substantially. The thermodynamic requirement of minimizing the magnetic energy will lead to the wall then being translated down the tapered portion nearest thereto of the magnetic films of bit structure 10.

As a result, the intermediate resistance characteristic collapses into the "0" characteristic. This is shown in FIG. 4B by several short arrows pointing directly from the intermediate characteristic shown as a dashed line to the lower "0" characteristic. Thus, the long arrows shown for the return to zero word line current follow along the lower characteristic to the zero value.

Thus, the application of a positive word current and a sense current to establish a magnetic state in bit structure 10 can be conveniently followed by an application of negative word current to assure that the magnetizations in central portions of the memory films in that bit structure all are oriented in essentially a common direction corresponding to the desired magnetization state. Experiment has shown that the number of erroneous bits of information in an array comprising bit structures like bit structure 10 is significantly reduced by this application of a negative word current for a short time following the positive word current and sense current normally used in establishing the desired magnetization state.

Although the present invention has been described with reference to preferred embodiments, workers skilled in the art will recognize that changes may be made in form and detail without departing from the spirit and scope of the invention.

What is claimed is:

1. A method for storing selected magnetic states in magnetic bit structures each comprising a memory film of a magnetoresistive, anisotropic, magnetic material between first and second terminal portions thereof and each having a word line conductor located across an electrical insulating layer from its said memory film which extends over a pair of opposite edges of that said memory film with each said edge extending between said first and second terminal portions, said memory film of each magnetic bit structure having an easy axis of magnetization oriented substantially along that direction in which its corresponding said word line conductor extends with directions of magnetization along said easy axis determining said magnetic states of that said magnetic bit structure, said memory film of each magnetic bit structure having portions thereof sufficiently near either of its said pair of opposite edges exhibiting magnetizations therein oriented substantially parallel to said edges with such edge magnetizations directed at least partially in substantially a common direction, said method comprising:

providing a selected activation current through a first said word line conductor in a direction which results in that magnetic field due thereto in said memory film of a corresponding first said magnetic bit structure being oriented substantially parallel to, and directed in, said common direction;

providing a selected sense current through said first magnetic bit structure memory film between said first and second terminal portions thereof which is at least partially concurrent with said providing of said activation current; and providing, after cessation of said activation current but at least partially concurrent with said providing of said sense current, a selected bit completion assurance current through said first word line conductor in a direction which results in that magnetic field due thereto in said memory film of said first magnetic bit structure being oriented substantially opposite to said common direction.

2. The method of claim 1 wherein a maximum value of said bit completion assurance current exceeds that of said activation current.

3. The method of claim wherein said sense current is selected to be provided through said first magnetic bit structure in a direction corresponding to that direction along said easy axis in which a resulting magnetization is intended to occur to thereby establish a corresponding said magnetic state.

4. The method of claim 1 wherein a change occurs in electrical resistance in said first magnetic bit structure memory film through which said sense current passes due to said activation current, said activation current reaching a value such that a relatively large shift occurs in said change in said electrical resistance with relatively little further activation current for one of said magnetic states occurring immediately theretofore in said first magnetic bit structure.

5. The method of claim 1 wherein a change occurs in electrical resistance in said first magnetic bit structure memory film through which said sense current passes due to said bit completion assurance current, said bit completion assurance current reaching a value such that a relatively large shift occurs in said change in said electrical resistance with relatively little further bit completion assurance current for one of said magnetic states occurring immediately theretofore in said first magnetic bit structure.

6. The method of claim wherein said sense current passes through a plurality of magnetic bit structures electrically connected in series with one another, including said first magnetic bit structure, each having a different word line conductor corresponding thereto.

7. The method of claim 1 wherein said first word line conductor corresponds to each of a plurality of magnetic bit structures, including said first magnetic bit structure, so that said activation current causes a magnetic field in said memory film of each oriented parallel to said common direction thereof, and so that said bit completion assurance current causes a magnetic field in said memory film of each oriented substantially opposite to said common direction thereof.

8. A method for storing selected magnetic states in magnetic bit structures each comprising a memory film of a magnetoresistive, anisotropic, magnetic material between first and second terminal portions thereof and each having a word line conductor located across an electrical insulating layer from its said memory film which extends over a pair of opposite edges of that said memory film with each said edge extending between said first and second terminal portions, said memory film of each magnetic bit structure having an easy axis of magnetization oriented substantially along that direction in which its corresponding said word line conductor extends with directions of magnetization along said easy axis determining said magnetic states of that said magnetic bit structure, said method comprising:

providing a magnetic field adequate to cause magnetizations of portions of said memory film sufficiently near either of said pair of opposite edges thereof, forming edge magnetizations, to be oriented substantially parallel to said edges so as to be directed at least partially in substantially a common direction;

providing a selected activation current through a first said word line conductor in a direction which results in that magnetic field due thereto in said memory film of a corresponding first said magnetic bit structure being oriented substantially parallel to, and directed in, said common direction;

providing a selected sense current through said first magnetic bit structure memory film between said first and second terminal portions thereof which is at least partially concurrent with said providing of said activation current; and providing, after cessation of said activation current but at least partially concurrent with said providing of said sense current, a selected bit completion assurance current through said first word line conductor in a direction which results in that magnetic field due thereto in said memory film of said first magnetic bit structure being oriented substantially opposite to said common direction.

9. The method of claim 8 wherein a maximum value of said bit completion assurance current exceeds that of said activation current.

10. The method of claim 8 wherein said sense current is selected to be provided through said first magnetic bit structure in a direction corresponding to that direction along said easy axis in which a resulting magnetization is intended to occur to thereby establish a corresponding said magnetic state.

11. The method of claim 8 wherein a change occurs in electrical resistance in said first magnetic bit structure memory film through which said sense current passes due to said activation current, said activation current reaching a value such that a relatively large shift occurs in said change in said electrical resistance with relatively little further activation current for one of said magnetic states occurring immediately theretofore in said first magnetic bit structure.

12. The method of claim 8 wherein a change occurs in electrical resistance in said first magnetic bit structure memory film through which said sense current passes due to said bit completion assurance current, said bit completion assurance current reaching a value such that a relatively large shift occurs in said change in said electrical resistance with relatively little further bit completion assurance current for one of said magnetic states occurring immediately theretofore in said first magnetic bit structure.

13. The method of claim 8 wherein said sense current passes through a plurality of magnetic bit structures electrically connected in series with one another, including said first magnetic bit structure, each having a different word line conductor corresponding thereto.

14. The method of claim 8 wherein said first word line conductor corresponds to each of a plurality of magnetic bit structures, including said first magnetic bit structure, so that said activation current causes a magnetic field in said memory film of each oriented parallel to said common direction thereof, and so that said bit completion assurance current causes a magnetic field in said memory film of each oriented substantially opposite to said common direction thereof.

15. A method for storing selected magnetic states in magnetic bit structures each comprising a memory film of a magnetoresistive, anisotropic, magnetic material between first and second terminal portions thereof and each having a word line conductor located across an electrical insulating layer from its said memory film which extends over a pair of opposite edges of that said memory film with each said edge extending between said first and second terminal portions, said memory film of each magnetic bit structure having an easy axis of magnetization oriented substantially along that direction in which its corresponding said word line conductor extends with directions of magnetization along said easy axis determining said magnetic states of that said magnetic bit structure, said memory film of each magnetic bit structure having portions thereof sufficiently near either of its said pair of opposite edges exhibiting magnetizations therein oriented substantially parallel to said edges with such edge magnetizations directed at least partially in substantially a common direction, said method comprising:

providing a selected activation current through a first said word line conductor in a direction which results in that magnetic field due thereto in said memory film of a corresponding first said magnetic bit structure being oriented substantially parallel to, and directed in, said common direction;

providing a selected sense current through said first magnetic bit structure memory film between said first and second terminal portions thereof which is at least partially concurrent with said providing of said activation current; and providing, after cessation of said activation current but at least partially concurrent with said providing of said sense current, a selected bit completion assurance current through said first word line conductor in a direction which results in that magnetic field due thereto in said memory film of said first magnetic bit structure being oriented substantially opposite to said common direction that is sufficient to cause a magnetic wall to form between said edge magnetizations and at least a portion of that said memory film interior thereto absent a magnetic wall being present, but also sufficient to reform a magnetic wall already present so as to increase its energy per unit length.

16. The method of claim 15 wherein a maximum value of said bit completion assurance current exceeds that of said activation current.

17. The method of claim 15 wherein said sense current is selected to be provided through said first magnetic bit structure in a direction corresponding to that direction along said easy axis in which a resulting magnetization is intended to occur to thereby establish a corresponding said magnetic state.

18. The method of claim 15 wherein a change occurs in electrical resistance in said first magnetic bit structure memory film through which said sense current passes due to said activation current, said activation current reaching a value such that a relatively large shift occurs in said change in said electrical resistance with relatively little further activation current for one of said magnetic states occurring immediately theretofore in said first magnetic bit structure.

19. The method of claim 15 wherein said sense current passes through a plurality of magnetic bit structures electrically connected in series with one another, including said first magnetic bit structure, each having a different word line conductor corresponding thereto.

20. The method of claim 15 wherein said first word line conductor corresponds to each of a plurality of magnetic bit structures, including said first magnetic bit structure, so that said activation current causes a magnetic field in said memory film of each oriented parallel to said common direction thereof, and so that said bit completion assurance current causes a magnetic field in said memory film of each oriented substantially opposite to said common direction thereof.

* * * * *

UNITED STATES PATENT AND TRADEMARK OFFICE
CERTIFICATE OF CORRECTION

PATENT NO. : 5,060,193

DATED : Oct. 22, 1991

INVENTOR(S) : DAUGHTON, et al.

It is certified that error appears in the above-identified patent and that said Letters Patent is hereby corrected as shown below:

Column 9, line 23, after "claim" insert --1--.

Column 9, line 48, after "claim" insert --1--.

Signed and Sealed this

Second Day of March, 1993

Attest:

STEPHEN G. KUNIN

Attesting Officer      Acting Commissioner of Patents and Trademarks